US012707880B2

(12) United States Patent
Spinelli et al.

(10) Patent No.: US 12,707,880 B2
(45) Date of Patent: Aug. 11, 2026

(54) LIGHT-TRANSMISSIVE MULTILAYER STRUCTURE COMPRISING A BARRIER STRUCTURE ARRANGED BETWEEN A SUBSTRATE AND AN ELECTRODE STRUCTURE FOR OPTOELECTRONIC DEVICES

(71) Applicant: SAULE S.A., Warsaw (PL)

(72) Inventors: Pierpaolo Spinelli, Wroclaw (PL); Mateusz Scigaj, Wroclaw (PL); Konrad Wojciechowski, Wroclaw (PL); Tanja Ivanovska, Wroclaw (PL)

(73) Assignee: SAULE S.A., Wroclaw (PL)

( * ) Notice: Subject to any disclaimer, the term of this patent is extended or adjusted under 35 U.S.C. 154(b) by 409 days.

(21) Appl. No.: 18/283,802

(22) PCT Filed: Mar. 22, 2022

(86) PCT No.: PCT/EP2022/057505
§ 371 (c)(1),
(2) Date: Sep. 24, 2023

(87) PCT Pub. No.: WO2022/200357
PCT Pub. Date: Sep. 29, 2022

(65) Prior Publication Data

US 2024/0172472 A1 May 23, 2024

(30) Foreign Application Priority Data

Mar. 23, 2021 (EP) .................................... 21461526

(51) Int. Cl.
*H10K 77/10* (2023.01)
*H10K 50/858* (2023.01)
*H10K 102/10* (2023.01)
*H10K 102/20* (2023.01)

(52) U.S. Cl.
CPC ......... *H10K 77/111* (2023.02); *H10K 50/858* (2023.02); *H10K 2102/102* (2023.02); *H10K 2102/103* (2023.02); *H10K 2102/20* (2023.02)

(58) Field of Classification Search
CPC ............... H10K 77/111; H10K 50/858; H10K 2102/102; H10K 2102/20; H10K 2102/103
USPC ........................................................... 257/40
See application file for complete search history.

(56) References Cited

U.S. PATENT DOCUMENTS

2019/0348621 A1* 11/2019 Wojciechowski .... C23C 14/081

FOREIGN PATENT DOCUMENTS

KR 20210004871 A * 1/2021 ............... H01B 5/14
WO 2015140090 A1 9/2019

* cited by examiner

*Primary Examiner* — Phuc T Dang
(74) *Attorney, Agent, or Firm* — Rivka Friedman

(57) ABSTRACT

A light-transmissive multilayer structure for optoelectronic devices contains a substrate, an electrode structure and a barrier structure arranged between the substrate and the electrode structure. The multilayer structure can be prepared as a deformable structure and it can be implemented in various optoelectronic devices.

15 Claims, 2 Drawing Sheets

LIGHT-TRANSMISSIVE MULTILAYER STRUCTURE COMPRISING A BARRIER STRUCTURE ARRANGED BETWEEN A SUBSTRATE AND AN ELECTRODE STRUCTURE FOR OPTOELECTRONIC DEVICES

TECHNICAL FIELD

The present disclosure relates to a light-transmissive electrode multilayer structure for optoelectronic (OP) devices. The multilayer structure can be prepared as a deformable, e.g., flexible foil, and it can be implemented in various OP devices, such as perovskite or organic PV devices, or OLEDs, acting as one of the electrodes, and preferably a front electrode, next to the light-sensitive material of the OP device.

BACKGROUND

From the patent literature, there are known thin, foil-like multilayer structures for various OP devices.

An international patent application WO2018139945 describes a translucent optoelectronic foil consisting of a plastic foil substrate, a conductive layer, and a barrier layer arranged between the conductive layer and the plastic substrate. The barrier is made of a material selected from silicon oxides, aluminum oxides, titanium oxides, silicon oxynitrides, silicon nitrides, organic silicon compounds, zirconium oxide, hafnium oxide, chromium oxides, and parylene, wherein the barrier layer may be a monolayer or multilayer structure. The conductive layer comprises at least two sublayers: an oxide layer (such as AZO, IZO, FTO, ZTO, ITO, GZO, GIO, IO:H, CdO, or TiOx), and a metal layer consisting of at least one metal selected from Al, Ti, Ni, Cr, Au, Mg, Ta, Ge, Ag, Cu, Zr, Pt and W. Due to the presence of the barrier layer arranged between the plastic foil substrate and the conductive layer, the foil exhibits water vapor permeability rates (WVTR) ranging between $10^{-3}$ and $10^{-6}$ $g/m^2$ per day, as well as stable barrier properties, including high hydrophobicity and UV radiation resistance. The conductive layer of the foil is an alternative to the single, thicker conductive ITO (indium tin oxide).

Further, a US patent application US20140054578 describes a multilayer electronic device mainly consisting of an organic polymer layer, and an electrode positioned against the polymer layer. The electrode is constituted by a thin metallic layer, a barrier to moisture and gases called a first barrier stack, an antireflection coating, and an overblocker layer made of metal being either oxidized or unoxidized. This overblocker layer is intended to protect the thin metallic layer during the deposition of a subsequent layer under an oxidizing or nitriding atmosphere. The multilayer structure of the electronic device may involve an architecture, e.g., such as $ZnO/Ag/Ti/TiO_x$, thus such that one metal layer (Ag) adjoins to another metal layer (Ti). Within the device architecture, the constituent barrier stack of the electrode layers is of alternating lower and higher refractive indices, providing this way an interference filter within the electrode structure. The barrier stack thus participates in the antireflection effect of the thin metallic layers of the electrode.

A patent application EP2871681 describes a back-contact substrate for a photovoltaic cell with a carrier substrate and an electrode coating. An electrode layer of the substrate consists of a metallic thin film, based on Al of the thickness 80-300 nm, an ohmic contact film, capable of forming a contact upon sulphurization or selenization, e.g, based on Mo or W, and a barrier to selenization of the thickness of to 50 nm, between the metallic layer and the ohmic contact film. However, this design does not suggest another possibility of the arrangement of respective layers. Moreover, said barrier layer can effectively control only a sodium migration.

Furthermore, a patent application EP2720276 describes a solar cell substrate comprising a multi-layer metal diffusion barrier that protects from metals diffusion. The metal diffusion barrier is made of the following materials: Cr, Ni, Ti, and metal oxide. Such the selection of materials used allows the layer to inhibit the diffusion of impurities: Na and Fe. This diffusion barrier layer is arranged, in the solar cell substrate, between the lower substrate and the lower electrode. Such architecture provides diffusion preventing effect of the substrate; par. 0043: "( . . . ) due to the interference by forming the metal layers together with the oxide layers such that the multilayered diffusion barrier layer functions as a barrier for blocking diffusion of impurities such as Na and Fe at the interface formed between different types of materials ( . . . )". In this solution, the metal layer is directly applied to the substrate, and the oxide metal layer is only disposed between two metals (within the multi-layered diffusion barrier layer) to effectively inhibit Na and Fe permeation.

Light transmittance constitutes an important factor for the functionality of multilayer optoelectronic (OP) devices. Thus, highly transparent antireflection coatings are typically involved within OP device multilayer structure aiming at reducing Fresnel reflection losses, thereby, increasing the amount of light that can pass through the layer structure of the OP device. This enhances the device's efficiency. The anti-reflection coatings are typically applied to a transparent substrate an external coating deposited on the outer side of the device. The antireflection coatings may be, e.g., made from glass or plastic. Thus, the anti-reflection coating can effectively reduce the surface reflection losses over a broad range of light wavelength and incidence angles. Typically, the antireflection coatings are of multilayer design involving a stack structure of alternating material layers of high and low refractive indexes. Furthermore, reduction of reflection losses can be also obtained by appropriate arrangement of materials and their thicknesses, within the OP device architecture.

Substantially, the refractive index (n) is defined as a dimensionless number that describes how fast light travels through the material. It is defined as n=c/v, where c is the speed of light in vacuum and v is the phase velocity of light in the given (considered) medium (material). For example, silicon dioxide ($SiO_2$) is known to be used for the production of antireflection coatings due to its low refractive index, good durability, and environmental resistance.

Furthermore, a scientific publication, "*High Refractive Index Polymer Coatings for Optoelectronics Applications*" T. Flaim, et all, Proceedings of SPIE—The International Society for Optical Engineering, February 2004 DOI: 10.1117/12.513363, describes a high refractive index polymer coatings for OP applications, such as flat panel displays, imaging sensors, photonic circuits, and light-emitting diodes. The polymer coating material has a refractive index in a range value of 1.6 to 1.9, and it is applied to the light-emitting or light-sensing portion of the device. This allows for a gradual transition from the high refractive index of the active circuitry, inside the OP device, to the low index of air, thereby, enabling the light to be coupled into, or out of the device, more effectively, increasing the device efficiency and/or image quality. The coating is made of a material being an organic-inorganic hybrid, made from titanium dioxide polymer precursor and a compatible organic polymer.

Moreover, an international patent application WO2015/140090A1 describes the layered photonic device in a form of a transparent substrate comprising an electrode. The device consists of layers arranged in a stack, support, a barrier layer, a scattering layer, a smoothing layer, a barrier sublayer, a crystallization sublayer, a metal conduction layer, and a buffer layer. The barrier sublayer, according to WO2015/140090A1, protects the electrode layers against chemicals, and especially against the contamination by the migration of alkaline substances coming from the support made of glass. This document is however silent on refractive index values of the barrier sublayer, and further, it imposes no restrictions on that matter when it comes to choosing the materials for the barrier sublayer. On the contrary, WO2015/140090A1 presents a wide range of the materials for the barrier sublayer, including titanium oxide, zirconium oxide, aluminum oxide, yttrium oxide, mixed oxides of zinc-tin, zincaluminum, zinc-titanium, zinc-indium, tin-indium, silicon nitride, silicon oxynitride, silicon oxycarbide, silicon oxycarbonitride, aluminum nitride, aluminum oxynitride, mixed nitride of aluminum-silicon, and mixed oxynitride of aluminum-silicon. The thickness of the buffer sublayer can vary from 20 to 200 nm. The above parameters can only anticipate a very wide range of refractive index values, which are however not mentioned in WO2015/140090A1.

As follows from the above-cited publications, the architectures of multilayered structures for OP devices undergo constant development which aims at improving both light transmittance and barrier characteristics of the OP devices, to enhance their efficiency and to prolong the lifespan of various OP devices.

Therefore, it would be desirable to further develop light-transmissive multilayer structures of electrode functionality, dedicated for OP devices, to further improve their barrier characteristics, including improved light-transmission, limitation of oxygen and moisture penetration of OP devices interior, and enhanced chemical stability of the OP devices employing said multilayer structure within their OP cells designs. It would be further desirable to develop especially the multilayer structures that exhibit improved deformability, especially flexibility, to broaden the scope of their applications.

SUMMARY OF THE DISCLOSURE

There is disclosed a light-transmissive multilayer structure for optoelectronic (OP) devices, comprising a substrate 11; an electrode structure 13; and a barrier structure 12 arranged between the substrate 11 and the electrode structure 13, the barrier structure 12 comprising barrier layers arranged in a barrier stack, the barrier stack comprising a backing layer A adjacent to the substrate 11, a buffer layer C adjacent to the electrode structure 13, and a blocking layer B arranged between the backing layer A and the buffer layer C; the electrode structure 12 comprising electrode layers arranged in an electrode stack, the electrode stack comprising a dielectric layer E, and a metallic layer D arranged between the buffer layer C of the barrier structure 12 and the dielectric layer E; wherein the buffer layer C comprises at least one material selected from the group consisting of $TiO_x$, $ZrO_2$, $Nb_2O_5$, $TeO_2$ and ZnS, wherein all materials of the buffer layer C have a refractive index value in the range from 2.2 to 2.6, and wherein a total thickness of the buffer layer C is from 10 to 60 nm; and wherein the metallic layer D comprises silver (Ag) and at least one metal selected from the group consisting of Al, Cu, Ti, Ge, Zn and Cr.

Preferably, the metallic layer D has a total thickness of 4 to 13 mm.

Preferably, the dielectric layer E comprises at least one transparent conductive oxide (TCO) selected from the group consisting of indium oxide ($In_2O_3$), tin oxide ($SnO_2$), zinc oxide (ZnO), vanadium oxide ($V_2O_5$), molybdenum oxide ($MoO_3$), tungsten oxide ($WO_3$), tin indium oxide (ITO), indium zinc oxide (IZO), aluminum zinc oxide (AZO) and indium gallium zinc oxide (IGZO).

Preferably, the dielectric layer E has a total thickness of 20 to 80 nm.

Preferably, the blocking layer B comprises at least one metal oxide selected from the group consisting of $AlO_x$, $SnO_x$, $ZnO_x$, $HfO_x$, $Al_yTi_zO$, $Al_yZr_zO$ and $Al_yZn_zO$, wherein all materials of the blocking layer B have a refractive index value in the range from 1.5 to 2.1.

Preferably, the blocking layer B has a total thickness of 10 to 100 nm.

Preferably, the backing layer A comprises at least one metal oxide selected from the group consisting of $TiO_x$, $SnO_x$, $ZrO_x$, $HfO_x$, $Al_yTi_zO$ and $Al_yZr_zO$.

Preferably, the backing layer A has a total thickness of 2 to 20 nm.

Preferably, all the materials of the backing layer A have a refractive index value (n) in the range from 1.6 to 2.6.

Preferably, the buffer layer C comprises mainly $TiO_x$, wherein all materials of the buffer layer C have refractive index value (n) in the range from 2.4 to 2.5.

Preferably, the buffer layer C has a total thickness of 20 to 50 nm.

Preferably, the blocking layer B comprises mainly $AlO_x$, wherein all materials of the blocking layer B have refractive index value in the range from 1.6 to 2.0.

Preferably, the metallic layer D comprises Ag and Cu in the amount of 90 at % of Ag and 10 at % of Cu.

Preferably, the layers A-E are independently selected from a monolayer structure or a multilayer structure, the multilayer structure comprising two or more than two sublayers.

Preferably, the substrate is made of a deformable foil comprising at least one material selected from the group consisting of polyethylene terephthalate (PET), polyethylene naphthalene (PEN), polyethylene (PE), polypropylene (PP), polyethersulfone (PES), polyimide (PI), polystyrene (PS), ethylene/tetrafluoroethylene (ETFE) and parylene.

BRIEF DESCRIPTION OF DRAWINGS

The object of the present disclosure is shown by example embodiments in a drawing, wherein.

The multilayer structure according to the present disclosure can be provided as deformable, e.g., flexible, light-transmissive (transparent, or translucent) foil comprising an electrode structure, which can be arranged preferably as a front electrode, either as cathode or anode—in various designs of OP devices, for example, with perovskite or organic light-sensitive region (e.g. OLEDs), depending on the special needs.

The multilayer structure comprises a substrate, an electrode structure, and a barrier structure arranged between the substrate and the electrode structure. This design, and further a developed architecture of said two structures (the electrode and barrier) as well as selected properties of materials used in these structures, together provide improved characteristics of the multilayer structure, including ultra-high barrier properties, enhanced chemical and thermal stability, high flexibility, higher light transmission of the entire stack, and low sheet resistance of the electrode. Inter alia, the multilayer structure exhibits improved barrier properties, water vapor transmission rate (WVTR) $1\times10^{-6}$-$1\times10^{-3}$ g/m$^2$ per day at 38° C./90% RH (Relative Humidity), higher flexibility—no changes are observed in barrier properties of the multilayer structure upon its bending with radius even as low as 0.5 cm (wherein the higher the bending radius the lower the curvature). Furthermore, the developed multilayer structure features improved light transmission of the barrier structure together with the electrode structure to over 80% AVT (average visible transmission), and low sheet resistance—below 20 Ohms/sq.

The above advantages are the effect of the developed certain order and selected materials for layers of the multilayer structure, as well as specific layers thickness and, thereby, selected refractive index values (n) of the materials for the layers, which together may be regarded as identification of certain subranges, for at least two, and more preferably two, three, or all of the layers arranged in the multilayer structure. According to the present disclosure, this special combination of materials selection and layers arrangement, in the stack, provides new and superior functionalities, and thereby an improvement in the overall characteristics of the multilayer structure.

Thereby, one aspect of the present disclosure is a special selection of the materials for the multilayer structure for OP device(s) taking into account various properties of the materials used.

Figure 1:
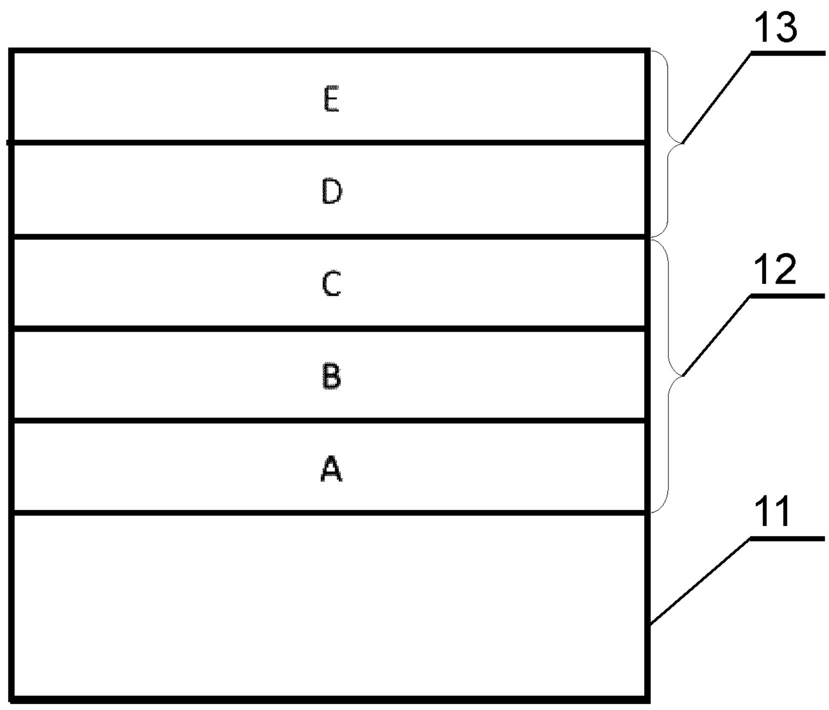
FIG. 1 shows schematically a multilayer structure for optoelectronic devices according to the present disclosure.

According to the present disclosure, a multilayer structure for optoelectronic device(s), as schematically shown in FIG. 1 comprises a substrate 11, preferably deformable, e.g., flexible substrate 11. The substrate may be made of various transparent or translucent materials, and preferably those providing deformability to the substrate 11. For example, the substrate may comprise foil or maybe substantially entirely made of foil, optionally with a primer coating provided on the foil surface. The preferred, non-limiting examples of plastic materials that are suitable to be used for the substrate 11 are polyethylene terephthalate (PET), polyethylene naphthalene (PEN), polyethylene (PE), polypropylene (PP), polyethersulfone (PES), polyimide (PI), polystyrene (PS), ethylene/tetrafluoroethylene (ETFE) and parylene, or mixture(s) thereof. The substrate 11 thickness depends on needs. For example, the substrate may be of thickness from 25 to 300 microns.

The multilayer structure further comprises an electrode structure 13 comprising a stack of electrode layers: D, E, arranged one on the top of the other, and a barrier structure 12 comprising a stack of barrier layers A, B, C, arranged one on the top of the other. The barrier structure 12 is arranged between the substrate 11 and the electrode structure 13. Each layer (D, E) of the electrode structure 13 as well as each layer (A, B, C) of the barrier structure 12, may be of monolayer or multilayer structure. Thus, the layer of multilayer structure may comprise at least two sublayers, one on top of the other. According to the present disclosure, any of the layers A, B, C, D, E of the multilayer structure may comprise said sublayers.

In order to prepare the multilayer structure, the barrier layers A, B, C and the electrode layers D, E of the respective structures 12, 13 may be sequentially deposited, on the substrate 11, one on the top of the other, using various deposition techniques. For example, each one of the layers: A, B, C, may be deposited using ALD (atomic layer deposition), or MLD (molecular layer deposition) technique, whereas each of D and E layers may be deposited using magnetron sputtering, thermal evaporation, chemical vapour deposition, or pulsed laser deposition, or similar technique. The same applies to the sublayers if they are present within any of the layers, A, B, C, D, E.

The barrier structure 12, comprises layers substantially made of metal oxides (or sulfides, such as ZnS in layer C), wherein barrier structure 12 comprises a backing layer A, adjacent to the substrate 11, for separating the remaining layers B-E from the substrate. The backing layer A is made of at least one metal oxide, preferably selected from the group consisting of $TiO_x$, $SnO_x$, $ZrO_x$, $HfO_x$, or complex metal oxides containing the combination of at least one of the metal atoms selected from the group consisting of Ti, Sn, Zr, and Hf and another metal atom such as, for example, Al or Zn, the non-limiting examples of the complex metal oxides are $Al_yTi_zO$ and $Al_yZr_zO$, where y may be of 0.25 to 1 ($0.25\leq y\leq1$), and z may be of 0.01 to 0.9 ($0.01\leq z\leq0.9$), wherein the preferred material for the backing layer A is $TiO_x$, due to its good durability and environmental resistance. Preferably, the backing layer A is of thickness from 2 to nm. Preferably, the backing layer A has a refractive index (n) of 1.6 to 2.6 ($1.6\leq n\leq2.6$), and more preferably each of the sublayers of layer A—if present, has a refractive index value of said range. However, the refractive index value of the backing layer A is of less critical importance to the optical transmission of the multilayer structure.

The thickness and selected material for the backing layer A provide desired chemical stability of the multilayer structure, including reduced hydrolysis of the multilayer structure from humid air. Thereby, in the developed architecture of the multilayer structure, the backing layer A acts as a layer of bottom buffer for the next layer: B. The backing layer A may be either a monolayer structure made of at least one oxide, or more than one metal oxide, e.g., $TiO_x$, and/or $SnO_x$, or the backing layer A may comprise at least two sublayers, each made from one metal oxide or more than one metal oxide, wherein, preferably, one of the sublayers is made of $TiO_x$, and the other sublayer may be made of $SnO_x$, within the backing layer A. The backing layer A can be deposited directly on the substrate 11, or it can be deposited on a primer coating of the substrate 11.

The barrier structure further comprises a buffer layer C and a blocking layer B, the blocking layer B being arranged between the buffer layer C and the backing layer A.

The blocking layer B may be either of monolayer or multilayer structure. In an embodiment of monolayer structure, the blocking layer B may be made of at least one, and more preferably made of two metal oxides selected from the group consisting of $SnO_x$, $AlO_x$, $ZnO_x$, and $HfO_x$, optionally with an addition of alucone, or complex metal oxides containing at least one of the metal atoms selected from the group consisting of Sn, Al, Zn and Hf and another metal atom such as Ti, Zr, within the metal oxide structure, the non-limiting examples of complex oxides are $Al_yTi_zO$, $Al_yZr_zO$, and $Al_yZn_zO$, where y may be of 0.25 to 1 ($0.25\leq y\leq1$), and z may be of 0.01 to 0.9 ($0.01\leq z\leq0.9$). Most preferably, the blocking layer B comprises $AlO_x$ as one metal oxide, and $SnO_x$ or $ZnO_x$ or $HfO_x$, as the other metal oxide. In an embodiment of multilayer structure, the blocking layer B may comprise two or more than two sublayers, where each sublayer may comprise at least one metal oxide. For example, the blocking layer B may comprise two sublayers one made of $AlO_x$ and the other made of SnOx or ZnOx or HfOx. In another embodiment blocking layer B may comprise several sublayers each made of different metal oxide, for example, the sublayers within one blocking layer B can be arranged in the following pattern, between layers A and C: A/AlOx/SnOx/ZnOx/HfOx/alucone/C. Preferably, the blocking layer B is of total thickness from 10 to 100 nm. Preferably, the blocking layer B has a refractive index (n) between 1.5 and 2.1 ($1.5 \leq n \leq 2.1$), and most preferably, the blocking layer B has a refractive index value which is close to the refractive index of $AlO_x$, $1.6 \leq n \leq 1.8$, and more preferably n=1.7. In the example where the blocking layer B is made from $AlO_x$, the refractive index of this layer can be n=1.7.

The selected materials for the blocking layer B and its thickness together provide an effective barrier function of layer B. Due to the presence of the blocking layer B and its arrangement within the multilayer structure, said multilayer structure exhibits improved barrier properties, including low water vapor permeability, as the water vapor transmission rate (WVTR) $1\times10^{-6}$-$1\times10^{-3}$ g/m$^2$ per day at 38° C./90% RH, and oxygen transmission rate (OTR) less than $1\times10^{-2}$ cm$^3$/m$^2$ day. Further, the selected material(s) of the blocking layer B give proper refractive index value (n) between 1.5 and 2.1, and preferably n=1.7, which contributes to improved light transmission through the multilayer structure.

The buffer layer C may be either of monolayer or multilayer structure. In an embodiment of monolayer structure, the buffer layer C may be made of one compound (oxide or sulphide) or more than one compound selected from the group consisting of $TiO_x$, $ZrO_2$, $Nb_2O_5$, $TeO_2$ and ZnS. Most preferably, the buffer layer C of monolayer structure comprises $TiO_x$, or it may be entirely made of $TiO_x$, as $TiO_x$ present in the buffer layer C provides improved chemical resistance of the multilayer structure, and thus, protection for the electrode structure 13 contained therein, simultaneously contributing to the required by the present disclosure high refractive index value (as described below), at the desired thickness of the buffer layer C.

Preferably, the buffer layer C is of total thickness at least 10 nm, and more preferably the buffer layer C is of total thickness from 10 to 60, and even more preferably of 20 to 50 nm. The buffer layer C has the refractive index (n) in the range of 2.2 to 2.6, and more preferably buffer layer C has the refractive index n=2.45. Such a high refractive index value of the buffer layer C, which is arranged between the electrode structure 13 and the blocking layer B, provides minimization of reflection losses at the interface of the electrode structure (D, E). The afore-mentioned features, together with the selected design of the electrode structure (metal-dielectric), provide improved stability and performance of the electrode structure 13 comprising layers D and E, respectively.

The developed barrier stack of the barrier structure 12 comprises layers A, B and C, each one made of at least one metal oxide (or sulphide). Furthermore, the buffer layer C, arranged next to close to the electrode structure 13, is selected to have a high refractive index $2.2 \leq n \leq 2.6$, and preferably n=2.45. These together provide improved light transition through the multilayer structure, where layer C (metal oxide and/or metal sulfide layer), is in the contact with a metallic layer: D.

Also, achieved good chemical stability, due to the above architecture, enables the multilayer structure to be laser etched, in the layers D and E of the electrode structure 12. Thus, the multilayer structure may be laser-patterned to obtain a designer cell architecture, when the multilayer structure is to be employed in the OP device.

Thus, the developed architecture of the multilayer structure provides its improved patterning behavior—without damaging underneath materials, i.e., layers C, B and A. Thus, the performed patterning does not impair barrier properties of the barrier structure 12.

Preferably, layer B is further selected to have high refractive index, $1.5 \leq n \leq 2.1$, and more preferably n=1.7. This, in combination with the refractive index value of layer C, further improves the light transition of the multilayer structure, while ensuring good barrier properties, at substantially low thickness of layer B up to 100 nm.

The electrode structure 13 comprises the electrode layers (E, D), the dielectric layer E, and the metallic layer D between the dielectric layer E and the buffer layer C of high refractive index. The metallic layer D comprises two or more than two metals. The metallic layer D may be of monolayer structure, preferably in a form of metallic alloy, e.g., bimetallic alloy, or the metallic layer D may be of a multilayer structure comprising two sublayers or more than two sublayers, preferably each sublayer made of one metal type, or metallic alloy.

The metallic layer D of the electrode structure 13 comprises preferably silver (Ag) and one or more than one metal, selected from the group consisting of Al, Cu, Ti, Ge, Zn and Cr. Preferably the metallic layer D is bimetallic. The total thickness of metallic layer D is from 4 to 13 nm. For example, layer D may consist of Cu/Ag alloy of Cu=10 at % and Ag=90 at %. This layer: D may be performed directly on the layer C by sputtering, and more preferably by co-sputtering where two separate metals, Ag and Cu, are used. By co-sputtering it is possible to make metal layers with a thickness as low as 4 nm, which provides very good conductivity with Rsh≤20 Ohm/sq. Optionally, co-sputtering of a single Ag/Cu alloy target can be used.

Preferably, the dielectric layer E of the electrode structure is of monolayer structure. The dielectric layer E is made of one or more than one TCO (transparent conductive oxide), preferably selected from the group consisting of indium oxide ($In_2O_3$), tin oxide ($SnO_2$), zinc oxide (ZnO), vanadium oxide ($V_2O_5$), molybdenum oxide ($MoO_3$), tungsten oxide ($WO_3$), or complex metal oxides containing at least one of the metal atoms selected from the group consisting of In, Sn, Zn, V, Mo and W, mentioned above and another dopant metal, within the complex oxide structure, such as, e.g., tin indium oxide (ITO), indium zinc oxide (IZO), aluminum zinc oxide (AZO), and indium gallium zinc oxide (IGZO) or similar complex metal oxides. The thickness of the dielectric layer E is 20-80 nm. Preferably, the dielectric layer E has high refractive index value between 1.8 and 2.2 ($1.8 \leq n \leq 2.2$). The thickness of dielectric layer E, falling into the above range, can be selected to optimize desired, preferably maximum light transmission of the multilayer structure, in the VIS or NIR region, depending on the respective application of the multilayer structure. Thus, the layer TCO (E), in combination with the underneath barrier structure 12, provides an antireflection-coating effect of the dielectric layer E. Furthermore, layer E protects against oxidation of the metallic layer D. Also, the layer E is suitable for forming a contact thereon, to combine the multilayer structure with, e.g., light-sensitive material, and next with another electrode, to form an OP device, for instance, a solar cell, e.g. perovskite or organic, or OLED, etc.

The developed stack of layers within the multilayer structure, engaging layers: C, and preferably also B; and E, provides the antireflection effect to the thin metallic layer D of the electrode structure. In more details, in the developed multilayer structure, the layer E acts as both a part of the electrode structure and an antireflection coating of layer D—from one side of the multilayers structure, whereas the layer C, preferably together with the layer B, act as antireflection coating for the layer D—from the other side. Simultaneously, the layers, B and C provide the barrier properties, as mentioned above. Thereby, the selective combination of layers implemented in the multilayer structure provides a reduction in reflection losses, hence it integrally functions as an antireflection system.

Mentioned herein, the metal oxides of general formula $MeO_x$, such as $SnO_x$, $TiO_x$, $ZnO_x$, $HfO_x$, in any of the layers or respective sublayers of the multilayer structure, according to the present disclosure, may be of stoichiometric and/or non-stoichiometric structure, and x may be of 1 to 2 ($1 \leq x \leq 2$). This is due to various oxidation states of metals in the respective metal oxides, which may be obtained at the preparation of the desired layer of material. For instance, for $SnO_x$, the material comprises $SnO_2$, however, in practice typically tin is not fully oxidized to Sn(IV), thus the material $SnO_x$ comprises $SnO_2$ and SnO, and what is the exact amount of $SnO_2$ phase and SnO phase depends on the exact deposition conditions. The same applies to other metal oxides, expressed herein as $MeO_x$. For example, the exact formula of $SnO_x$ material may be $SnO_{1.8}$. The non-limiting examples of materials expressed herein as $MeO_x$, are $TiO_2$, $SnO_2$, $SnO_{1.8}$, $ZrO_2$, $HfO_2$, ZnO, $Al_2O_3$.

Furthermore, the arrangement of the electrode structure comprising the metallic layer D and the TCO layer E, provides the metal-dielectric electrode architecture in the multilayer structure according to the present invention. This provides superior flexibility over the known dielectric-metal-dielectric structures, whilst the layer E made of dielectric material provides antireflection effect to the metallic layer D.

The materials for the respective layers B, C, and E are selected due to their refractive indexes values, for example, $AlO_x$ has n=1.7, SnO has n=1.9, ZnO has n=2.0, $TiO_x$ has n=2.45, ITO has n=2.0, $ZrO_2$ has n=2.2, which are typical n values for the materials used in the following embodiments of the present disclosure.

In a preferred embodiment of the present disclosure, the multilayer structure may comprise, a plastic substrate and the following stack of the layers:

- layer A comprises $TiO_x$, and more preferably is made of $TiO_x$, a total thickness of layer A is of 2 to 20 nm, and refractive index value of 2.45;
- layer B comprises $AlO_x$ and another metal oxide that has a refractive index value close to that of $AlO_x$, i.e., n=1.7; the total thickness of the layer B is 10-100 nm; layer B may be of mono- or multilayer structure;
- layer C comprises $TiO_x$, and has a refractive index of 2.45, or layer C may comprise another metal oxide providing a refractive index value of 2.2 to 2.6; a total thickness of layer C is of 20 to 50 nm,
- layers D and E together provide a metal-dielectric (M-dielectric) electrode structure, where layer D is made of two metals, one of which being Ag, a total thickness of layer D is 4 to 13 nm; and dielectric layer E is made from TCO; so that the electrode structure, including layers D and E, may be patterned, and preferably, laser patterned or chemically patterned.

As already mentioned, due to the specifically selected sub-ranges of the certain parameters, including, selected material used, thicknesses, and reflective index values of the respective layers—at least layer C, and further preferably layer B and/or layer E together with the implementation of M-dielectric electrode structure, the developed multilayer structure exhibits improved chemical stability, better adhesion of the layers (A-D) within the stack, as well as adhesion of A-E layers to the substrate. Further, the multilayer structure can be performed as a substantially thinner structure—the whole stack of A-D layers can be less than 250 nm thick, and the stack of A-C layers can be less than 100 nm thick, and more preferably less than 60 nm thick. This further provides higher flexibility of the multilayer structure, reflecting in no functionality losses upon bending test with at least 1000 cycles and the bending radius down to 0.5 cm. Additionally, the selected material(s) for layer C, and preferably also for layer B and layer E—each having relatively high refractive index value, sufficiently minimizes reflection losses at the interface of the barrier (A-C) and the electrode (D-E) structure—which constitutes another technical effect provided by the present disclosure. This positively affects the incident light, which enters or is emitted by the transparent/translucent substrate or through the electrode region of the OP device. Thus, the OP device with the multilayer structure implemented thereon can show enhanced efficiency.

Moreover, according to the present disclosure, the blocking layer B, preferably made of $AlO_x$ is effectively sandwiched, and thereby encapsulated with other metal oxide (or sulfide) layers (e.g. ZnS for layer C), and therefore, the other layers A, C, and E have yet additional functionalities, as mentioned above. This provides a prolonged lifespan for the OP devices employing the multilayer structure according to the present disclosure.

It should be further noted that the above-mentioned effects are provided without any organic additives within the multilayer structure. Thus, according to the present disclosure, no organic layer(s) and/or additive(s) are required between and/or within the layers (A-E), and the only organic material within the multilayer structure may be a polymeric substrate 11. Thus, the developed multilayer architecture can be prepared substantially simply and cost-efficiently.

Embodiment 1

The substrate is a PET foil was cleaned by sonication in IPA (70% Isopropyl Alcohol), and next dried by nitrogen gun. Next, the layers: A, B, C were subsequently deposited by ALD technique at 100° C., without breaking the vacuum between each layer deposition. All the layers were optimized to be as dense as possible, to additionally enhance good permeation barrier properties, chemical stability. The layers were formed in a form of a stack on the substrate. The detailed composition of each layer is as follows:

the barrier structure: layer A: $TiO_x$ (5 nm thick); layer B: sublayer $AlO_x$ (20 nm thick)/sublayer $ZnO_x$ (10 nm thick), sublayer $AlO_x$ (20 nm thick); layer C: $TiO_x$ (32 nm thick).

Next the electrode region: layers: D+E were deposited, each layer was deposited by magnetron sputtering. The detailed composition of each layer is as follows:

- the electrode structure: layer D: Cu/Ag (Cu: 10 at %; Ag: 90 at %) co-sputtered layer (7 nm thick). The co-sputtering was performed with 2 separate metal targets (Ag and Cu) with different power; layer E: ITO layer (40 nm thick) from an ITO target.

The obtained multilayer structure was in a form of flexible transparent foil of the arrangement of the following layers: PET/$TiO_x$ (5 nm)/$AlO_x$ (20 nm)/$ZnO_x$ (10 nm)/$AlO_x$ (20 nm)/$TiO_x$ (32 nm)/CuAg (7 nm)/ITO (40 nm).

Figure 2:
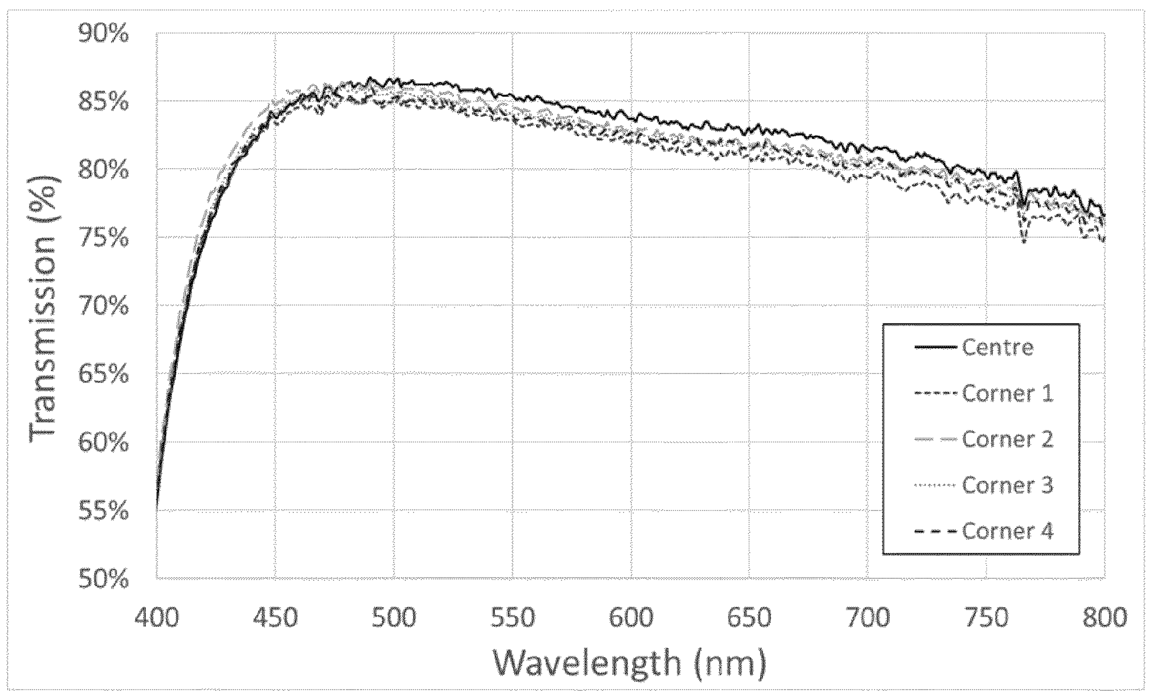
FIG. 2 shows experimental data of light transmission of the multilayer structure according to Embodiment 1 of the present disclosure.

The obtained multilayer structure was next tested, to evaluate its transmission characteristics, both in the visible (VIS) and in the infrared (IR) spectral range. The obtained results are set in the diagram in FIG. 2, which shows the transmission of the foil (the multilayer structure) with its full structure, as measured on a 10×10 $cm^2$ sample (in the center and at the corners). As follows from the diagram of FIG. 2, the average visible transmission in the center is 82%, and at the corner 80.4-81.6%. Therefore, an excellent transmission above 80% could be achieved over a large area.

Other parameters of the obtained foil are as follows: sheet resistance: 13.5 Ohm/sq (typical ITO with similar transmission has Rsh above 20 Ohm/sq); WVTR of barrier stack: ~$10^{-6}$ g/$m^2$/day; OTR of barrier stack: ≤$5*10^{-4}$ cc/$m^2$/day (OTR was below detection limit).

Embodiment 2

The multilayer structure in a form of transparent flexible foil was prepared at the same conditions, as Embodiment 1. The obtained foil was of the following architecture:

Substrate: PET

Layer A: $SnO_x$, 5 nm thick, made by ALD

Layer B: $AlO_x$, 50 nm thick, made by ALD

Layer C: $TiO_x$, 32 nm thick, made by ALD

Region D: Cu/Ag (10/90 atomic %), 7 nm thick, made by sputtering

Region E: ITO, 40 nm thick, made by sputtering

Figure 3:
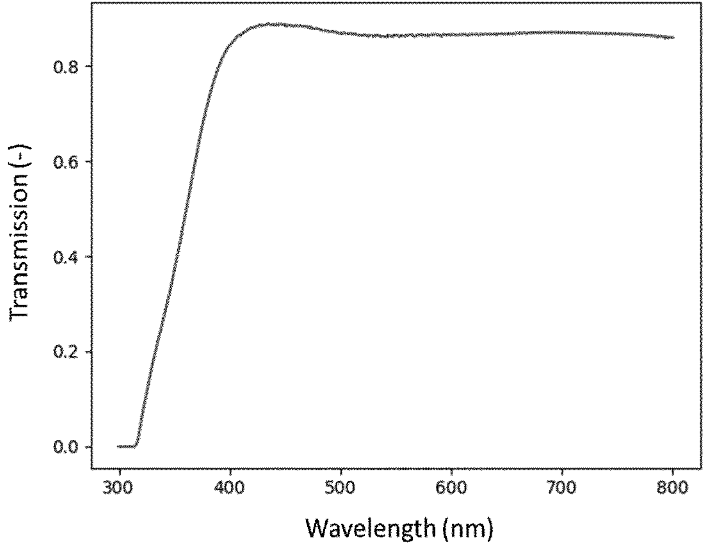
FIGS. 3-4 show simulations of light transmission of the multilayer structure according to Embodiment 2 and Embodiment 3 of the present disclosure.

For the above architecture, a computer simulation has been conducted, to evaluate its optical transmission. The obtained data are set in the diagram, in FIG. 3. As can be seen, optical transmission of the obtained foil is well above 80%, in the visible 400-800 nm spectral range.

Embodiment 3

The multilayer structure in a form of transparent flexible foil was prepared at the same conditions, as Embodiment 1. The obtained foil was of the following architecture:

Substrate: PET

Layers A: $TiO_x$, 5 nm thick, made by ALD

Layer B: sublayer $AlO_x$ (10 nm thick)/sublayer $ZnO_x$ (10 nm thick)/sublayer $AlO_x$ (10 nm thick)/sublayer $ZnO_x$ (10 nm thick)/sublayer $AlO_x$ (10 nm thick), all made by ALD Layer C: $ZrO_x$, 35 nm thick, made by ALD Layer D: Cu/Ag (10/90 atomic %), 7 nm thick, made by sputtering Layer E: ITO, 40 nm thick, made by sputtering.

Figure 4:
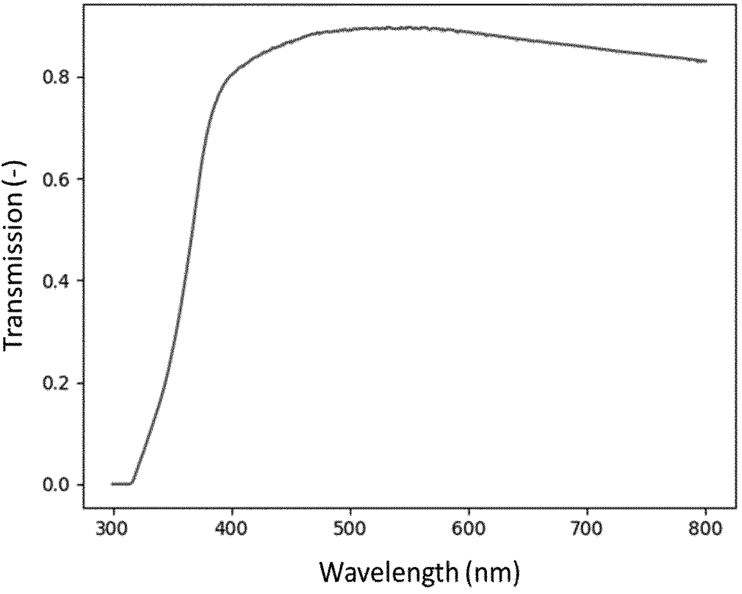

The obtained layer stack has a form of flexible transparent foil which yielded an optical transmission well above >80% in the visible 400-800 nm spectral range, as shown by the simulation in FIG. 4.

The invention claimed is:

1. A light-transmissive multilayer structure for an opto-electronic device, the light-transmissive multilayer structure comprising:

a substrate, an electrode structure, and a barrier structure arranged between the substrate and the electrode structure, wherein the barrier structure comprises barrier layers arranged in a barrier stack, the barrier stack comprising a backing layer (A) adjacent to the substrate, a buffer layer (C) adjacent to the electrode structure, and a blocking layer (B) arranged between the backing layer (A) and the buffer layer (C), wherein the electrode structure comprises electrode layers arranged in an electrode stack, the electrode stack comprising a dielectric layer (E), and a metallic layer (D) arranged between the buffer layer (C) of the barrier structure and the dielectric layer (E);

wherein the buffer layer (C) comprises at least one material selected from a group consisting of $TiO_x$, $ZrO_2$, $Nb_2O_5$, $TeO_2$ and ZnS, wherein all materials of the buffer layer (C) have a refractive index value in a range from 2.2 to 2.6, and wherein a total thickness of the buffer layer (C) is from 10 to 60 nm, wherein the metallic layer (D) comprises silver (Ag) and at least one metal selected from a group consisting of Al, Cu, Ti, Ge, Zn and Cr, and wherein the layers (A)-(E) are directly adjacent to each other.

2. The light-transmissive multilayer structure according to claim 1 wherein the metallic layer (D) has a total thickness of 4 to 13 mm.

3. The light-transmissive multilayer structure according to claim 1, wherein the dielectric layer (E) comprises at least one transparent conductive oxide selected from a group consisting of indium oxide ($In_2O_3$), tin oxide ($SnO_2$), zinc oxide (ZnO), vanadium oxide ($V_2O_5$), molybdenum oxide ($MoO_3$), tungsten oxide ($WO_3$), tin indium oxide (ITO), indium zinc oxide (IZO), aluminum zinc oxide (AZO) and indium gallium zinc oxide (IGZO).

4. The light-transmissive multilayer structure according to claim 1, wherein the dielectric layer (E) has a total thickness of 20 to 80 nm.

5. The light-transmissive multilayer structure according to claim 1, wherein the blocking layer (B) comprises at least one metal oxide selected from a group consisting of $AlO_x$, $SnO_x$, $ZnO_x$, $HfO_x$, $Al_yTi_zO$, $Al_yZr_zO$ and $Al_yZn_zO$, wherein all materials of the blocking layer (B) have a refractive index value in a range from 1.5 to 2.1.

6. The light-transmissive multilayer structure according to claim 1, wherein the blocking layer (B) has a total thickness of 10 to 100 nm.

7. The light-transmissive multilayer structure according to claim 1, wherein the backing layer (A) comprises at least one metal oxide selected from a group consisting of $TiO_x$, $SnO_x$, $ZrO_x$, $HfO_x$, $Al_yTi_zO$ and $Al_yZr_zO$.

8. The light-transmissive multilayer structure according to claim 1, wherein the backing layer (A) has a total thickness of 2 to 20 nm.

9. The light-transmissive multilayer structure according to claim 1, wherein all materials the of the backing layer (A) have a refractive index value (n) in a range from 1.6 to 2.6.

10. The light-transmissive multilayer structure according to claim 1, wherein the buffer layer (C) comprises mainly $TiO_x$, wherein all materials of the buffer layer (C) have refractive index value (n) in a range from 2.4 to 2.5.

11. The light-transmissive multilayer structure according to any claim 1, wherein the buffer layer (C) has a total thickness of 20 to 50 nm.

12. The light-transmissive multilayer structure according to claim 1, wherein the blocking layer (B) comprises mainly $AlO_x$, wherein all materials of the blocking layer (B) have refractive index value in a range from 1.6 to 2.0.

13. The light-transmissive multilayer structure according to claim 1, wherein the metallic layer (D) comprises Ag and Cu in the amount of 90 at % of Ag and 10 at % of Cu.

14. The light-transmissive multilayer structure according claim 1, wherein the layers (A)-(E) are independently selected from a monolayer structure or a multilayer structure, the multilayer structure comprising two or more than two sublayers.

15. The light-transmissive multilayer structure according to claim 1, wherein the substrate is made of a deformable foil comprising at least one material selected from a group consisting of polyethylene terephthalate (PET), polyethylene naphthalene (PEN), polyethylene (PE), polypropylene (PP), polyethersulfone (PES), polyimide (PI), polystyrene (PS), ethylene/tetrafluoroethylene (ETFE) and parylene.

* * * * *